(12) United States Patent
Park et al.

(10) Patent No.: US 12,167,577 B2
(45) Date of Patent: Dec. 10, 2024

(54) PLUGGABLE MODULE AND CAGE FOR IMPROVING AIRFLOW IN NETWORK SWITCH SYSTEM

(71) Applicant: Arista Networks, Inc., Santa Clara, CA (US)

(72) Inventors: Youngbae Park, Milpitas, CA (US); Jose Manuel Ochoa Castellanos, Salida, CA (US); Ernest Mason Thurlow, Mountain View, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 309 days.

(21) Appl. No.: 17/882,290

(22) Filed: Aug. 5, 2022

(65) Prior Publication Data

US 2023/0397374 A1    Dec. 7, 2023

Related U.S. Application Data

(60) Provisional application No. 63/349,441, filed on Jun. 6, 2022.

(51) Int. Cl.
*H05K 7/20* (2006.01)
*H05K 7/14* (2006.01)

(52) U.S. Cl.
CPC ....... *H05K 7/20709* (2013.01); *H05K 7/1487* (2013.01); *H05K 7/2039* (2013.01)

(58) Field of Classification Search
CPC .. G02B 6/4269; G02B 6/4261; G02B 6/4284; G02B 6/428; G02B 6/4268; G02B 6/3897; G02B 6/426; G02B 6/4278; H04B 10/40; H04B 1/036; H04B 1/38; H05K 7/20409;
(Continued)

(56) References Cited

U.S. PATENT DOCUMENTS

| | | | | |
|---|---|---|---|---|
| 5,757,998 A | * | 5/1998 | Thatcher | G02B 6/4261 385/75 |
| 8,613,632 B1 | * | 12/2013 | Nichols | H01R 13/6587 439/485 |
| 9,668,379 B1 | * | 5/2017 | Bucher | H05K 7/20436 |

(Continued)

FOREIGN PATENT DOCUMENTS

EP    3432044 A1    1/2019

OTHER PUBLICATIONS

International Search Report and Written Opinion, International Searching Authority, PCT Application No. PCT/US2023/067431, mailed Sep. 25, 2023.

*Primary Examiner* — Michael A Matey
(74) *Attorney, Agent, or Firm* — Fountainhead Law Group, PC (57) ABSTRACT

A switch system including a plurality of pluggable modules, a plurality of cages housing the plurality of pluggable modules, and a host printed circuit board (PCB). The system is designed to improve airflow around the host PCB to facilitate cooling. The cages may be designed to have airflow openings on a bottom surface thereof (facing towards the host PCB). The pluggable modules may be designed to have a heat sink on an external lower surface (facing towards the host PCB), which may be in the form of external fins. The host PCB may be designed to have cut-outs in a front portion thereof. The cooperation of the, and the airflow openings, heat sinks, and cut-outs create improved airflow for cooling of the host PCB.

20 Claims, 7 Drawing Sheets

(58) Field of Classification Search
CPC ........... H05K 7/20145; H05K 7/20709; H05K 7/1487; H05K 7/2039
See application file for complete search history.

(56) References Cited

U.S. PATENT DOCUMENTS

| | | | | |
|---|---|---|---|---|
| 9,793,667 | B1* | 10/2017 | Park | H04Q 1/02 |
| 10,295,767 | B2* | 5/2019 | Chen | G02B 6/4269 |
| 10,411,423 | B1 | 9/2019 | Park et al. | |
| 10,651,607 | B1* | 5/2020 | Gawlowski | H01R 13/659 |
| 10,921,536 | B2 | 2/2021 | Park et al. | |
| 2010/0142171 | A1* | 6/2010 | Chen | H05K 9/0058 361/800 |
| 2012/0039047 | A1* | 2/2012 | Nichols | H05K 7/1418 361/715 |
| 2012/0099275 | A1* | 4/2012 | Regnier | H05K 7/20145 361/690 |
| 2012/0182688 | A1* | 7/2012 | McColloch | H04B 10/40 361/692 |
| 2012/0257355 | A1* | 10/2012 | Yi | G02B 6/4269 361/704 |
| 2013/0164970 | A1* | 6/2013 | Regnier | H01R 13/533 165/185 |
| 2014/0056592 | A1* | 2/2014 | McColloch | H04B 10/40 29/428 |
| 2015/0124404 | A1* | 5/2015 | Shen | H05K 7/20709 361/694 |
| 2017/0077643 | A1* | 3/2017 | Zbinden | G02B 6/4268 |
| 2017/0168253 | A1* | 6/2017 | Wilcox | G02B 6/4278 |
| 2017/0285282 | A1* | 10/2017 | Regnier | G02B 6/3879 |
| 2018/0212385 | A1* | 7/2018 | Little | H01R 13/6273 |
| 2018/0248305 | A1* | 8/2018 | Regnier | H01R 13/533 |
| 2018/0338387 | A1* | 11/2018 | Park | G02B 6/4284 |
| 2019/0027850 | A1* | 1/2019 | Jau | H01R 12/675 |
| 2020/0220289 | A1* | 7/2020 | Scholeno | H05K 7/1427 |
| 2020/0221607 | A1* | 7/2020 | Bucher | H01R 12/716 |
| 2021/0022268 | A1* | 1/2021 | Sharf | F28F 3/025 |
| 2021/0231890 | A1* | 7/2021 | Chopra | H05K 7/20409 |
| 2021/0235597 | A1* | 7/2021 | Chopra | G02B 6/4269 |
| 2022/0003946 | A1* | 1/2022 | Edwards, Jr. | G02B 6/4268 |
| 2022/0099903 | A1* | 3/2022 | Tsai | G02B 6/4292 |
| 2022/0141990 | A1* | 5/2022 | Gupta | H05K 7/2039 361/709 |
| 2022/0159878 | A1* | 5/2022 | Dillman | H05K 7/20509 |
| 2023/0258891 | A1* | 8/2023 | Gupta | H05K 7/20409 361/688 |
| 2024/0192454 | A1* | 6/2024 | Saturley | H05K 7/2049 |

\* cited by examiner

PLUGGABLE MODULE AND CAGE FOR IMPROVING AIRFLOW IN NETWORK SWITCH SYSTEM

CROSS REFERENCE TO RELATED APPLICATIONS

Pursuant to 35 U.S.C. § 119(e), this application is entitled to and claims the benefit of the filing date of U.S. Provisional App. No. 63/349,441 filed Jun. 6, 2022, the content of which is incorporated herein by reference in its entirety for all purposes.

BACKGROUND

Network devices use optical cables to deliver fast and more reliable communication. An optical pluggable module is a transceiver module that has one end connected to an optical cable, electronics that translate the optical signal into an electronic signal, and another end plugged into a network device that will process the electronic signal. A coaxial pluggable module is similar but applies to coaxial cable. There are multiple standardized optical (and coaxial) pluggable module form factors. Using modules with standardized form factors, network devices can be configured for different optical (or coaxial) cables and different performance capabilities in a convenient, well accepted, industry-favored manner. Examples of pluggable module form factors include SFP (small form factor pluggable), QSFP (quad small form factor pluggable) and OSFP (octal small form factor pluggable, or octal small format pluggable) for optical cable, and CXP (CoaXPress) for coaxial cable.

As the processing speeds of the devices increase and the volume designated for components and packaging remains limited, the power density becomes higher and higher, and cooling of the modules (and electronics in the modules) becomes more critical. Many systems attempt to incorporate a single heat sink with forced air flow, for thermal cooling of the optical module. Geometrical restrictions on the location of the heat sink within the optical module are obstacles that limit the cooling capacity and prevent uniform cooling. In addition, the electrical connector, which connects the optical module to the host PCA (Printed Circuit Assembly) prevents airflow to the bottom area, i.e., in the direction of the host PCA. Therefore, there is a need in the field for a solution that overcomes the drawbacks described above.

BRIEF DESCRIPTION OF THE DRAWINGS

With respect to the discussion to follow and in particular to the drawings, it is stressed that the particulars shown represent examples for purposes of an illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

Various embodiments of an optical transceiver module, corresponding modular cage, and host printed circuit board (PCB) described herein improve the airflow through the network switch for improved cooling of the host PCB. These features could be adapted to other electronics modules, in further embodiments and are not limited to an optical transceiver, and may be referred to as either "transceiver modules" or simply "modules" herein. Orientation terms used herein, such as "top", "bottom", "front", "upper", "lower", etc. should be considered as relative to embodiments of the modules, rather than absolute with respect to gravity, as the modules may be installed in various orientations in equipment at various positions and have airflows directed relative to those orientations.

Embodiments of the transceiver module, corresponding modular cage, and host PCB described herein dissipate more heat more efficiently. Semiconductors are continually shrinking and becoming faster, and the denser arrangements of electronics requires dissipating more heat in smaller spaces. Embodiments of the transceiver module (which may be an OSFP (octal small form factor pluggable or octal small format pluggable) module), the corresponding modular cage, and the host PCB described below improve thermal management inside the network switch. The network switch system described herein may be capable of performing multiple functions, such as switching and/or routing.

In some aspects, the techniques described herein relate to a switch system including: a frame including at least one top compartment and at least one bottom compartment, a host printed circuit board (PCB) located between the at least one top compartment and the at least one bottom compartment, the host PCB having at least one cut-out, a plurality of modules, wherein each module of the plurality of modules includes a first heat sink, and a plurality of cages, wherein each cage of the plurality of cages including a first surface having a plurality of airflow openings therethrough. Each module is received in a respective cage, at least one cage is received in the at least one top compartment such that the first surface faces towards the host PCB, and at least one module is received in the at least one cage located in the at least one top compartment such that the first heat sink faces towards the host PCB. Additionally, at least one cage is received in the at least one bottom compartment such that the first surface faces towards the host PCB, and at least one module is received in the at least one cage located in the at least one bottom compartment such that the first heat sink faces towards the host PCB, and the at least one cut-out of the host PCB is aligned with the plurality of airflow openings. An airflow from a front of the switch system to a rear of the switch system is facilitated by the plurality of airflow openings, the at least one cut-out, and the first heat sink.

In some aspects, the techniques described herein relate to a switch system including: a first plurality of modules, a first plurality of cages for receiving each of the first plurality of modules, and a printed circuit board (PCB) located beneath the first plurality of cages and the first plurality of modules. Each of the first plurality of cages includes a first plurality of airflow openings to allow air to pass through a bottom of each cage in the first plurality of cages to the first module airflow channel. Each module includes a first heatsink located on a bottom side, the first heatsink including a first corrugated surface creating a first module airflow channel. The PCB includes at least one cut-out located adjacent to the first plurality of airflow openings. Air is configured to pass from a front of the PCB, through the at least one cut-out, the first plurality of airflow openings, and the first module airflow channel to a rear of the switch system.

In some aspects, the techniques described herein relate to a method of cooling a switch system including: providing a switch system, and allowing airflow from a front of the switch system to a rear of the switch system around the host PCB through the plurality of airflow openings and the module airflow channel. The switch system includes a frame including a front faceplate having longitudinal divider forming at least one top compartment and at least one bottom compartment, a host printed circuit board (PCB) located behind the longitudinal divider and between the at least one top compartment and the at least one bottom compartment, a plurality of cages located in the at least one top compartment and the at least one bottom compartment, and a plurality of modules, each module being received within one of the plurality of cages. Each cage includes a first surface having a plurality of airflow openings therethrough. Each module includes a first heat sink creating a module airflow channel. Each cage is arranged such that the first surface faces towards the host PCB, and each module is arranged such that the first heat sink faces towards the host PCB.

In the following description, for purposes of explanation, numerous examples and specific details are set forth in order to provide a thorough understanding of embodiments of the present disclosure. Particular embodiments as expressed in the claims may include some or all of the features in these examples, alone or in combination with other features described below, and may further include modifications and equivalents of the features and concepts described herein.

In a high-speed switch, the front panel may have a high-density IO (input/output) panel. In an embodiment, a 1 RU (rack unit) high speed switch includes 36 ports of the OSFP in a belly-to-belly configuration for a standard 19-inch rack. In this case, the OSFP ports are mounted on the top and the bottom of the main host PCB and the host PCB is placed in approximately the center of the switch. In such a configuration, almost all the area of the faceplate (front IO panel) is filled with the connectors.

When the system is designed to be cooled by forced air convection, by circulating air through the front faceplate, there is limited space to add air inlets in the faceplate. The area in front of the host PCB is not traditionally utilized for the airflow in a high-density IO (input/output) front panel of 36 OSFPs in 1 RU (rack unit), because there is no air passage that extends from the front of the host PCB through to the back of the switch. In an embodiment, the design and arrangement of the components provides an airflow channel from the area of the faceplate in front of the host PCB to the back of the device, helping the overall cooling of the system.

Figure 1:
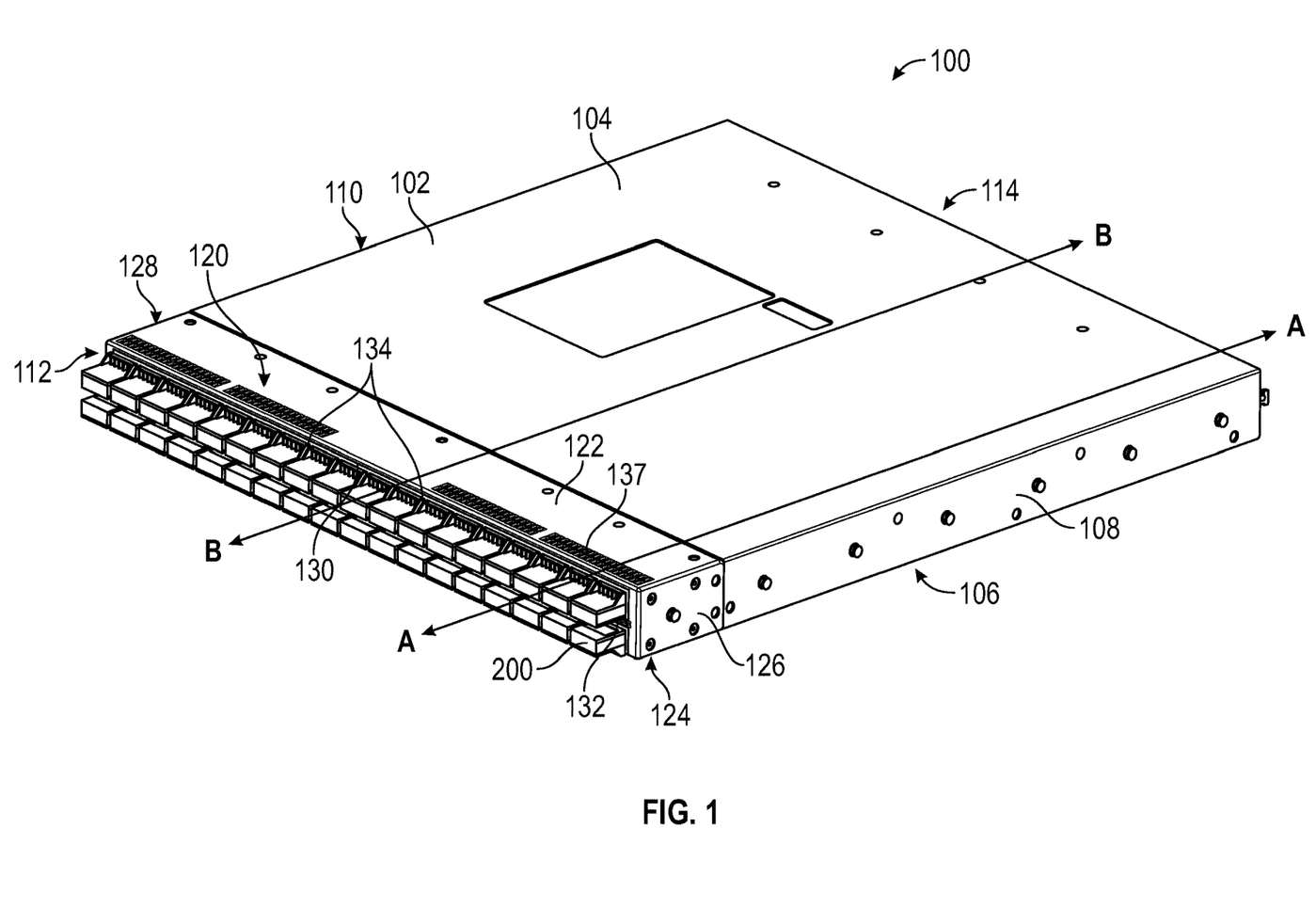
FIG. 1 shows an example high-speed switch system including 36 OSFP module ports and the modules therein.

FIG. 1 shows an exemplary high-speed switch system 100 including thirty-six OSFP ports/cages housing thirty-six modules 200. An embodiment of an exemplary module 200 is shown in more detail in FIGS. 5A-B. System 100 includes frame 102, which may be generally rectangularly shaped in some embodiments. Frame 102 may include top surface 104, bottom surface 106, first side surface 108 and second side surface 110. Frame 102 may be open on front side 112 to receive modules 200 therein. Frame 102 may also be open on back side 114 to receive other hardware components therein. Any or all of top surface 104, bottom surface 106, first side surface 108, and second side surface 110 may include small openings for receiving connectors therein. Exemplary connectors may include screws, bolts, rivets, or other known mechanical connectors. Frame 102 may contain multiple dividers therein (not shown) for receiving and mounting hardware components therein (not shown). In some embodiments, system 100 may further include a separate front frame 120 located at front side 112 of frame 102. In some embodiments, front frame 120 may be part of or integral with frame 102. Front frame 120 may be rectangularly shaped in some embodiments. Front frame 120 may include top surface 122, bottom surface 124, first side surface 126 and second side surface 128. In some embodiments, bottom surface 124 may extend distally further than top surface 122. Front frame 120 may include front faceplate 130 having divisions for receiving and holding modules 200 therein.

Front faceplate 130 may include six substantially rectangular compartments in some embodiments. In some embodiments, front faceplate 130 may include three upper compartments and three lower compartments. In some embodiments, each compartment may be configured to receive six modules 200 therein, such that the system 100 can receive thirty-six modules 200 therein. In some embodiments, front faceplate 130 includes a central horizontal divider 132, which separates the top compartments 138 from the bottom compartments 140. In some embodiments, front faceplate 130 includes 2 vertical dividers 134. Vertical dividers may include a first set of vent openings 136. Front frame 120 may further include a second set of vent openings 137 in top surface 122, as can be more clearly seen in FIG. 2. In some embodiments, second set of vent openings 137 may be arranged in groups, such as shown in FIG. 1. In some embodiments, front frame 120 may include four groups of vent openings 137 on top surface 122. In some embodiments, the size of vent openings 136 or 137 may be about 2.5 mm to about 3.5 mm. In some embodiments, the vent openings 137 and/or 136 may be about 2.5 mm. In some embodiments, the size of the first set of vent openings 136 may be different from the size of the second set of vent openings 137. In some embodiments, the size of vent openings 137 may be about 2.5 mm and the size of the vent openings 136 may be about 1.5 mm×2.5 mm. In some embodiments, the size of all vent openings 136 and 137 may be identical. In some embodiments, there may be more or fewer vent openings 136 or 137.

Figure 2:
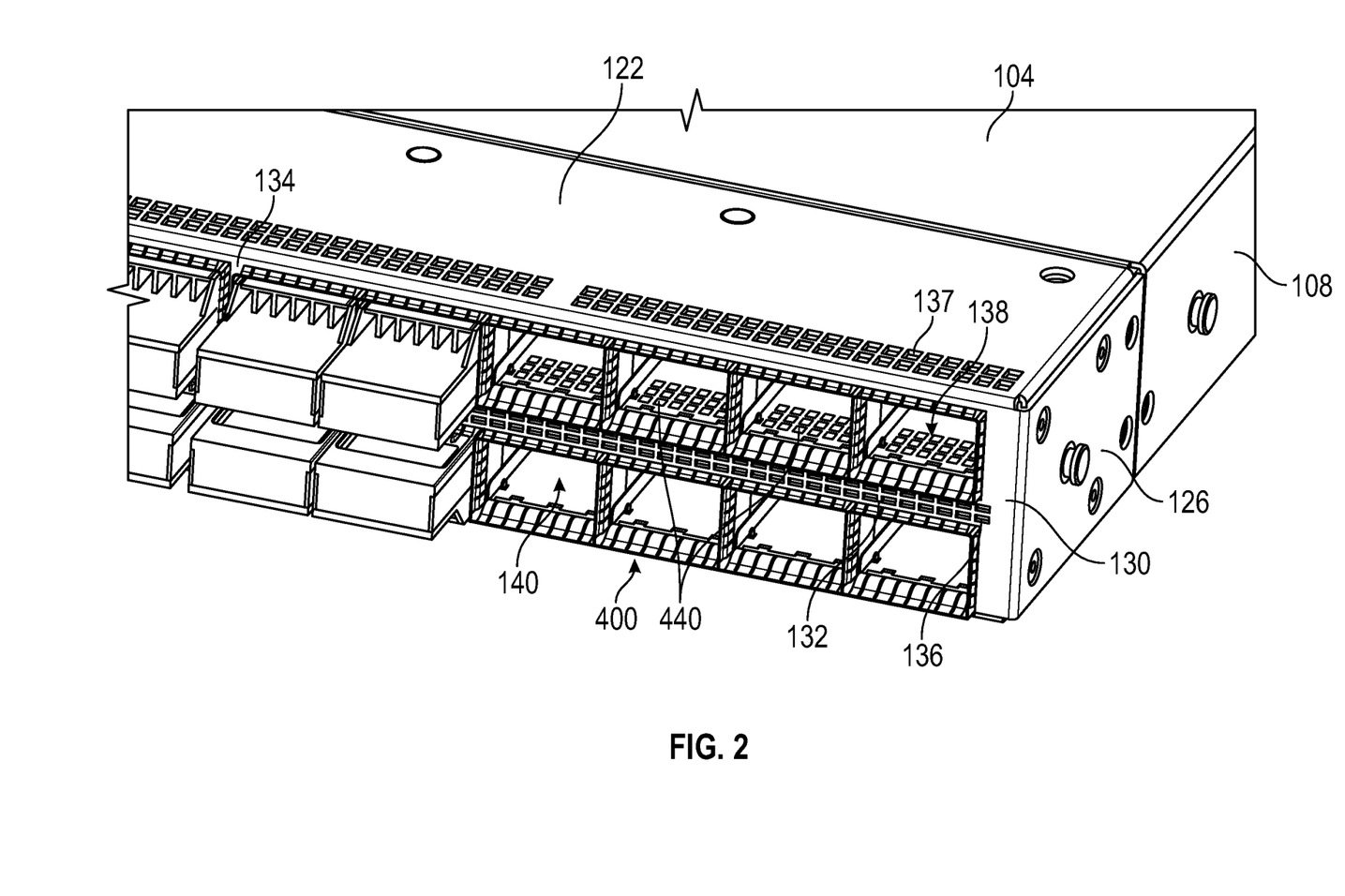
FIG. 2 is a magnified view of the example high-speed switch system of FIG. 1 with some of the modules removed.

FIG. 2 shows a magnified view of the front side 112 of high-speed switch system of FIG. 1 with eight of the modules 200 shown as removed. Specifically, four modules 200 in top compartment 138 are hidden and four modules 200 in the bottom compartment 140 are hidden so as to better view front frame 120. Top compartment 138 and bottom compartment 140 house cages 400 for receiving the modules 200 therein. Specifically, each cage 400 is sized and shaped to receive one module 200 therein.

Figure 3:
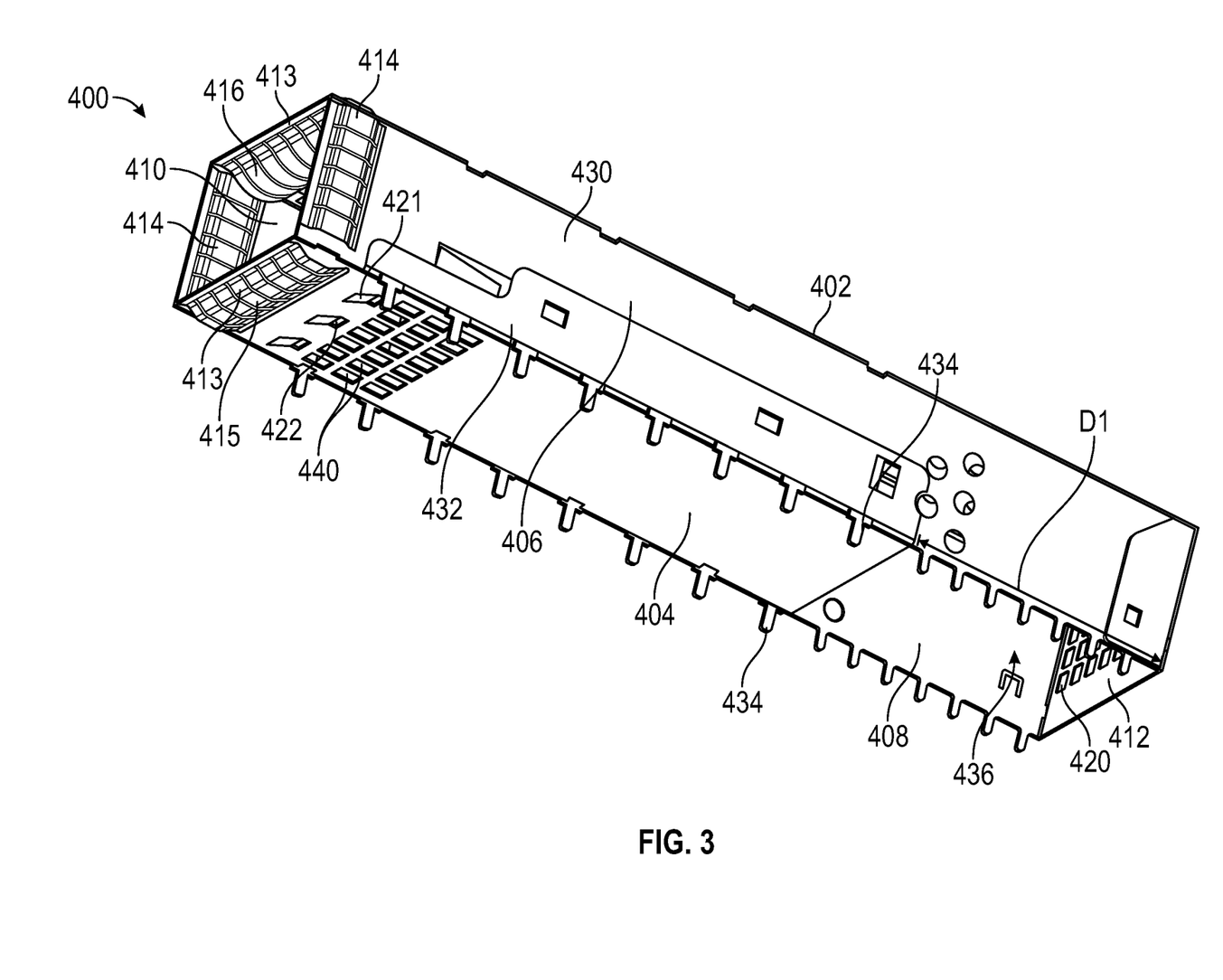
FIG. 3 is a perspective view of an example modular cage for housing one module of the switch system of FIG. 1.

FIG. 3 shows a perspective view of an embodiment of one cage 400. In some embodiments, thirty-six of such cages 400 would be provided within one system 100. In some embodiments, more or fewer than thirty-six cages can be provided in system 100 with a respective number of modules being capable of being provided. In some embodiments, cage 400 includes top side 402, bottom side 404, first side 406, second side 408, front opening 410, and back panel 412. In some embodiments, front opening 410 may include a specially shaped curved portions 413, 414 on one or more sides for electromagnetic interference (EMI) shielding.

Figure 4A:
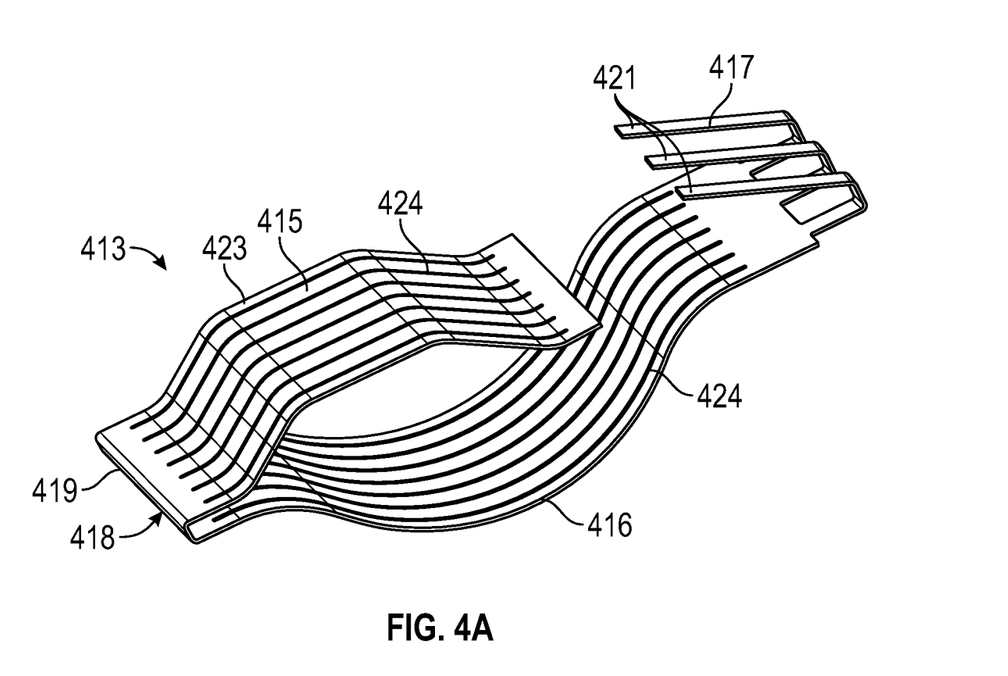
FIG. 4A is a perspective view of a first curved portion on the front opening of the example cage for EMI shielding.
Figure 4B:
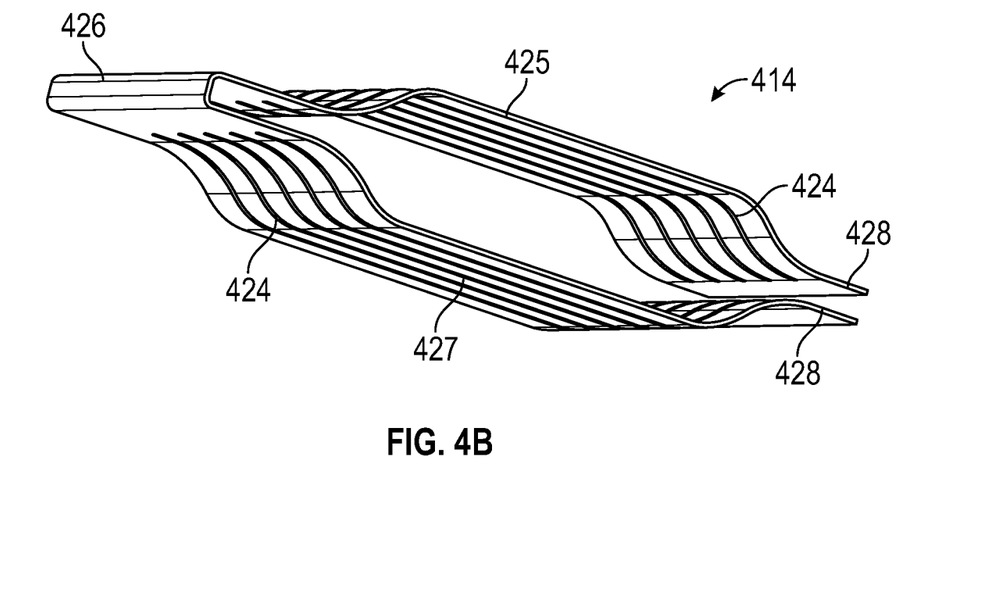
FIG. 4B is a perspective view of a second curved portion on the front opening of the example cage for EMI shielding.

Curved portion 413 is shown in detail in FIG. 4A and curved portion 414 is shown in detail in FIG. 4B. In some embodiments, a first curved portion 413 may be mounted on top side 402 of cage 400 and a second curved portion 413 may be mounted on bottom side 404 of cage 400. Curved portion 413 may include outer curve 415, inner curve 416, rear fork-like portion 417, and front nose portion 418. Front nose portion 418 may have a flat front face 419. Rear fork-like portion 417 may have fingers 421 that may be resilient and/or elastic to facilitate connection to cage 400. For example, fingers 421 may extend through openings 422 in top side 402 or bottom side 404. Outer curve 415 may have a flat central portion 423. Both outer curve 415 and inner curve 416 may have slits 424 therethrough.

In some embodiments, front nose portion 418 of a first curved portion 413 is configured to attach to the outer surface of top side 402 at the front of cage 400 and inner curve 416 is configured to extend into the front opening 410 of cage 400, as seen in FIG. 3. Outer curve 415 of first curved portion 413 is configured to extend above top side 402 with a space formed therebetween. In some embodiments, front nose portion 418 of a second curved portion 413 is configured to attach to outer surface of bottom side 404 at the front of cage 400 and inner curve 416 is configured to extend into the front opening 410 of cage 400, as seen in FIG. 3. Outer curve 415 of second curved portion 413 is configured to extend below bottom side 404 with a space formed therebetween.

With respect to FIG. 4B, curved portion 414 is shown. In some embodiments, a first curved portion 414 may be mounted to first side 406 and a second curved portion 414 may be mounted to second side 408. Curved portion 414 may include outer curve 425, front nose portion 426, inner curve 427, and rear flat portions 428. Similar to curved portion 413, both outer curve 425 and inner curve 427 may include slits 424 therethrough.

In some embodiments, front nose portion 426 of a first curved portion 414 is configured to attach to outer surface of first side 406 at the front of cage 400 and inner curve 427 is configured to extend into the front opening 410 of cage 400, as seen in FIG. 3. Outer curve 425 of first curved portion 414 is configured to extend from first side 406 with a space formed therebetween. In some embodiments, front nose portion 426 of a second curved portion 414 is configured to attach to outer surface of second side 408 at the front of cage 400 and inner curve 427 is configured to extend into the front opening 410 of cage 400, as seen in FIG. 3. Outer curve 425 of second curved portion 414 is configured to extend from second side 408 with a space formed therebetween. Rear flat portions 428 may be resilient and/or elastic to facilitate connection to cage 400.

Figure 7:
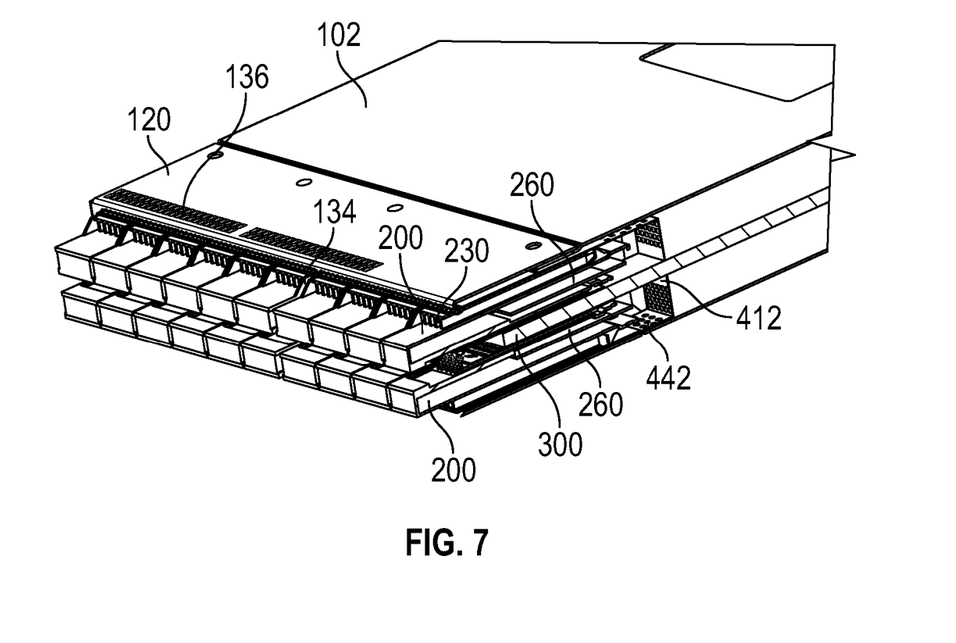
FIG. 7 is a perspective cross-sectional view of the example switch system view taken along line B-B in FIG. 1 showing the host printed circuit board located between a top row of modules within cages and a bottom row of modules within cages.

With reference to FIG. 3, in some embodiments, cage 400 may be composed of a top frame 430 and a bottom frame 432 connected together. In some embodiments, cage 400 may be formed as a unitary piece. In some embodiments, projections 434 may extend from the bottom of first side 406 and from the bottom of second side 408, such as from top frame 430, for connecting to the host printed circuit board (PCB) 300. Bottom frame 432 includes bottom side 404 that may extend from the front opening 410 to a distance D1 spaced from the back panel 412 such that there is a bottom opening 436 in the distal portion of the cage 400. In some embodiments, top frame 430 includes back panel 412. In some embodiments, back panel 412 includes a plurality of airflow openings 420 therethrough. Top side 402 may also include openings 442 therethrough located near the back panel 412 for improving airflow, as can be seen in FIG. 7.

Figure 5A:
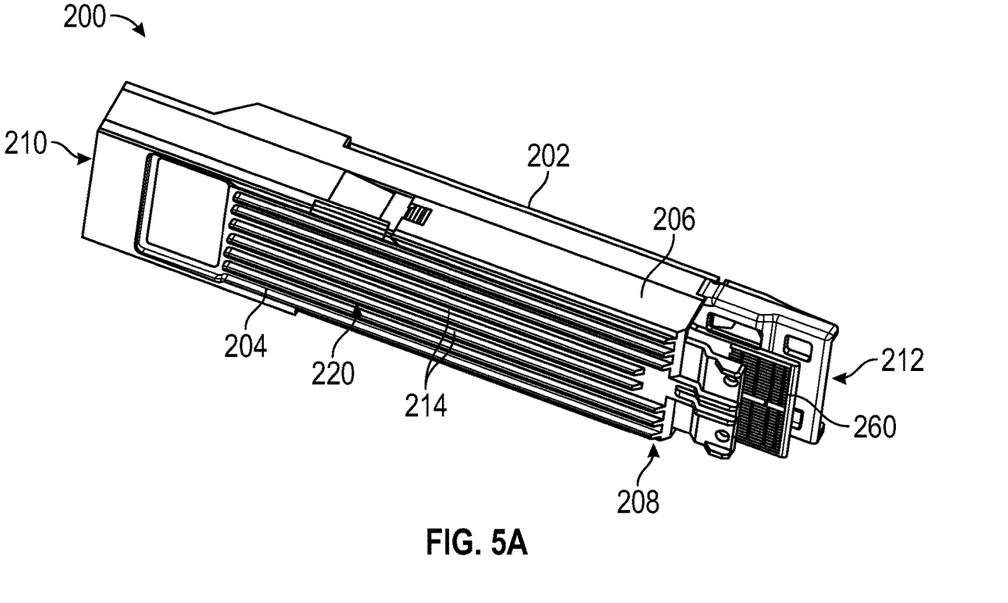
FIG. 5A is a bottom perspective view of an embodiment of one module of the switch system of FIG. 1.

As seen in FIGS. 2 and 3, bottom side 404 may have airflow openings 440 for receiving airflow therethrough located at a proximal portion near front opening 410. In some embodiments, airflow openings 440 and/or airflow openings 420 are rectangularly shaped. In some embodiments, airflow openings 440 and/or airflow openings 420 may be arranged in a 7×3 matrix configuration. In some embodiments, airflow openings 440 form a lattice design that is aligned with the projections 214 extending from the bottom surface 204 of module 200, as can be seen in FIG. 5A. However, the airflow openings 440 may be any shape or size or configuration as desired to best facilitate airflow therethrough. In some embodiments, airflow openings 420 may be shaped or configured similar to airflow openings 440. In some embodiments, airflow openings 420 may be shaped or configured differently from airflow openings 440.

As seen in FIG. 2, all the modular cages 400 within the switch system are identical, however the top row of modular cages 400, such as those located in top compartment 138, are arranged in an opposite orientation from the bottom row of modular cages 400, such as those located in bottom compartment 140. Specifically, the cages 400 are arranged in a "belly to belly configuration" such that they are flipped across the host PCB 300, which is located therebetween, as will be discussed hereinafter with respect to FIGS. 7-9. Thus, the bottom side 404 of a first cage 400 mounted in top compartment 138 will face the bottom side 404 of a second cage 400 mounted in bottom compartment 140, as seen in FIG. 2.

Figure 5B:
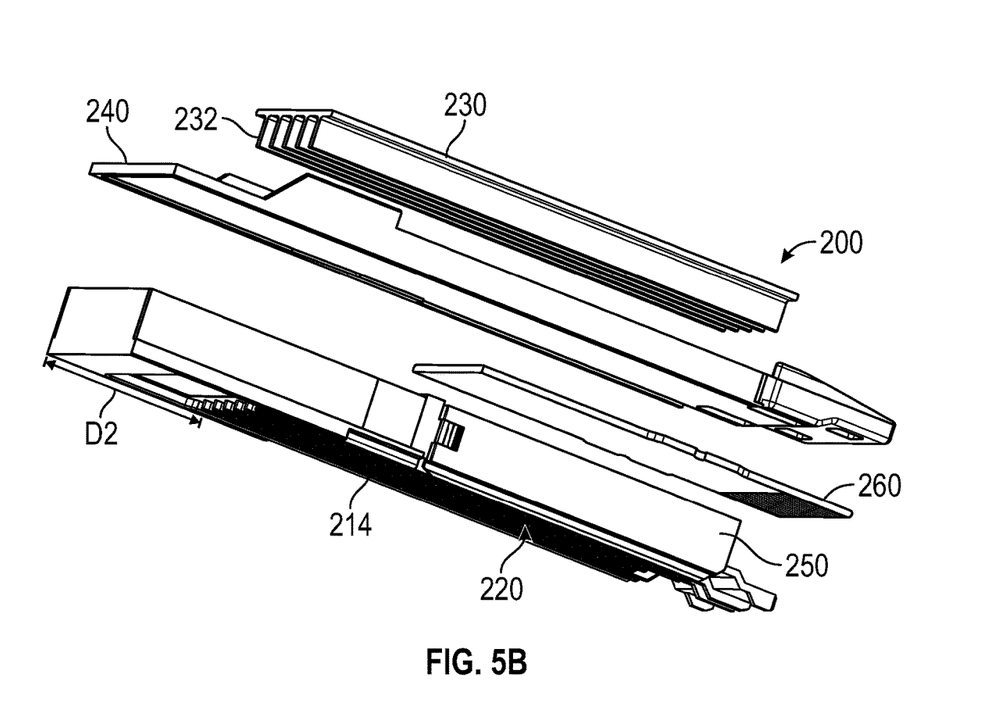
FIG. 5B is an exploded view of an embodiment of one module of the switch system of FIG. 1.

FIGS. 5A-B illustrate an embodiment of an exemplary module 200. FIG. 5A shows a bottom perspective view of module 200. Module 200 includes top surface 202, bottom surface 204, first side surface 206, second side surface 208, front end 210, and rear end 212. In some embodiments, bottom surface 204 includes a first heat sink 220. In some embodiments, first heat sink 220 may be in the form of external fins. In some embodiments, external fins may include projections 214 extending longitudinally along the length of the module 200, such as seen in FIG. 5A. In some embodiments, projections 214 may extend along a substantial portion of the module 200. In some embodiments, projections 214 may begin a distance D2 from the front end 210 of module 200. When module 200 is received within cage 400, bottom surface 204 of module 200 faces an inner surface of bottom side 404 of cage 400. Projections 214 space the module 200 vertically away from the bottom side 404 of the cage 400 thereby facilitating air flow therethrough.

FIG. 5B is an exploded view of module 200. Module 200 includes top frame 240 and bottom frame 250 and a module printed circuit board 260 therebetween. In some embodiments, a second heat sink 230 may be provided on top surface 202 of module 200. In some embodiments, second heat sink 230 may be in the form of internal fins. In some embodiments, internal fins may include projections 232 extending longitudinally along the length of the module 200. In some embodiments, projections 232 may extend along a substantial portion of the module 200. In some embodiments, projections 232 may begin a distance D2 from the front end 210 of module 200.

In some embodiments, heat sinks 220, 230 may be made of aluminum or other thermal-conductive material such as copper, steel, various alloys and composite materials, etc. In some embodiments heat sink 220 may be composed of a different material than heat sink 230. In some embodiments, the height of the projections 214, 232 may be about 0.5 mm to about 1.65 mm. In some embodiments, the height of the projections 214, 232 may be about 1.15 mm to about 1.35 mm. In some embodiments, the height of the projections 214, 232 may be about 1.25 mm. In some embodiments, the height of the projections 214, 232 may be greater than about 0.5 mm. In some embodiments, projections 214 may be a different height and/or length than projections 232. In some embodiments, projections 214 may be the same height and/or length as projections 232.

As seen in FIG. 2, all the modules 200 within the switch system are identical, however the top row of modules 200, such as those located in top compartment 138, are arranged in an opposite orientation from the bottom row of modules 200, such as those located in bottom compartment 140. Specifically, the modules 200 are arranged in a "belly to belly configuration" such that they are flipped across the host PCB 300 which is located therebetween, as will be discussed hereinafter with respect to FIGS. 7-9. Thus, the bottom surface 204 of a first module 200 mounted in top compartment 138 will face the bottom surface 204 of a second module 200 mounted in bottom compartment 140, as seen in FIG. 7.

As seen in FIGS. 1-2, each module 200 may be received within a respective cage 400. When module 200 is received within cage 400, top surface 202 of module 200 faces an inner surface of top side 402 of cage 400 and bottom surface 204 of module 200 faces an inner surface of bottom side 404 of cage 400. Additionally, first side surface 206 of module 200 faces an inner surface of first side 406 of cage 400, and second side surface 208 faces an inner surface of second side 408 of cage 400. Front end 210 of module 200 projects out of front opening 410 a first distance, which is approximately the distance D2. Therefore, the front of projections 232 and projections 214 are aligned approximately with front opening 410 of cage 400, as can be seen in FIG. 2. Additionally, the vent openings 440 in bottom side 404 of cage 400 are arranged below heat sink 220 for the top row of modules (or arranged above heat sink 220 for the bottom row of modules). Specifically, in some embodiments, vent openings 440 align with the spaces or troughs between projections 214 to facilitate airflow. Therefore, the arrangement of module 200 and cage 400 allows for air to flow therebetween, thus facilitating cooling of host PCB 300, which is received between the rows of top and bottom modules as seen in FIG. 7-9.

Figure 6:
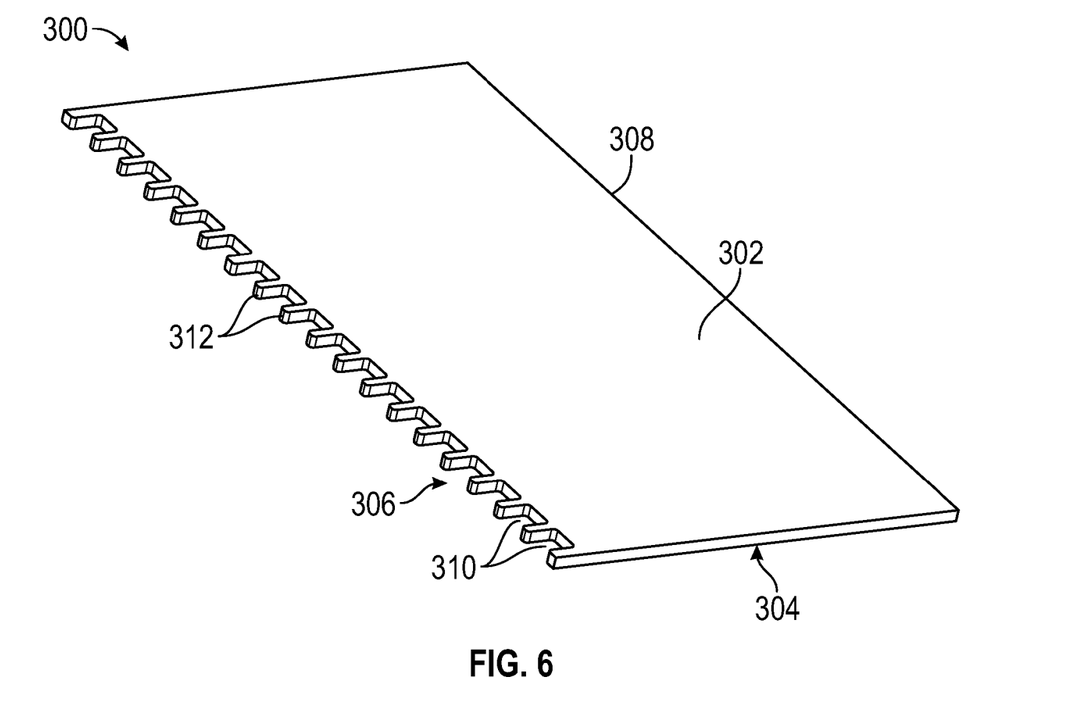
FIG. 6 is a perspective view of an embodiment of a host printed circuit board (PCB) that is housed within the high-speed switch system of FIG. 1.

FIG. 6 shows an exemplary host PCB 300. System 100 may include a unitary host PCB 300 that extends along substantially the entire width of front frame 120. In some embodiments, host PCB 300 may be located within frame 102 and front frame 120 in between the top compartments 138 and the bottom compartments 140. Host PCB 300 may be aligned with the central horizontal divider 132 of front faceplate 130 such that vent openings 136 can provide airflow to host PCB 300. Host PCB 300 thus extends between all modules 200 from the first side surface 126 to the second side surface 128.

Host PCB 300 includes top surface 302, bottom surface 304, front side 306, and back side 308. In some embodiments, front side 306 includes a specially shaped edge. Front side 306 may include a plurality of notches or cut-outs 310 with extensions 312 therebetween. In some embodiments, cut-outs 310 may be of a rounded rectangular shape. In some embodiments, cut-outs 310 may be square, curved, or any other desired shape. In some embodiments, the extensions 312 may be approximately aligned with the first side 406 and the second side 408 of cage 400 of each cage 400, such that the cut-outs 310 are approximately aligned with the airflow openings 440. Other forms and shapes of the PCB 300 are possible, including a smaller PCB that does not include extensions 312 formed by notches 310. In some embodiments, there may be more or less extensions 312.

Figure 8:
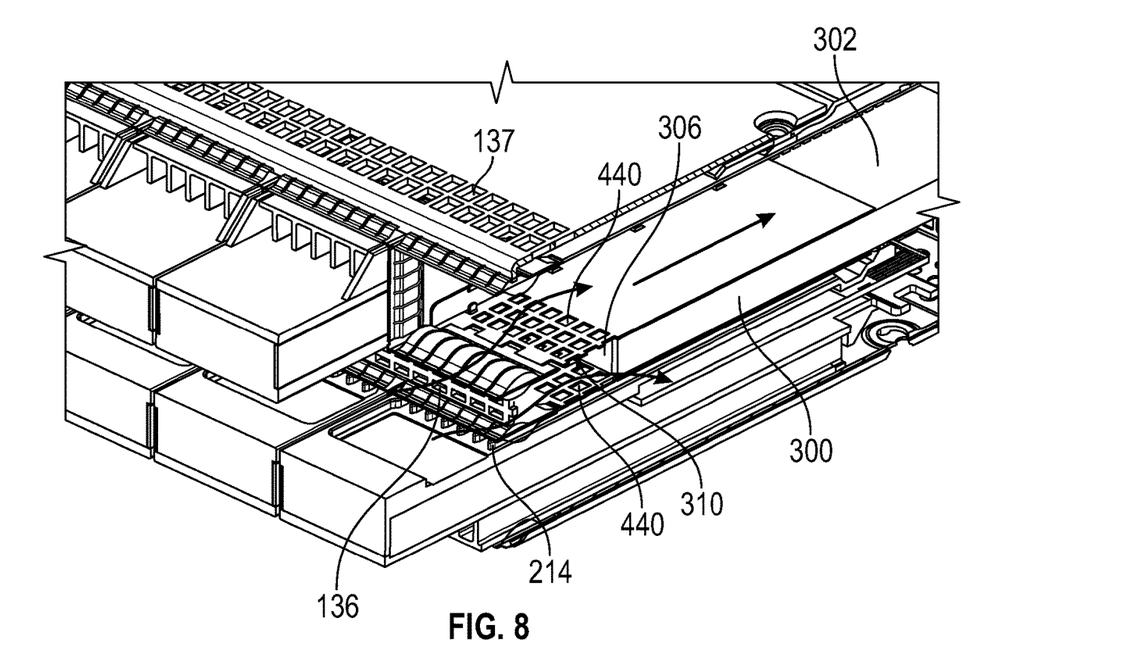
FIG. 8 shows a cross-sectional magnified view taken along line A-A in FIG. 1 of the bottom airflow openings of the cages with a PCB cut-out located therebetween (the first top module is hidden for ease in viewing)
Figure 9:
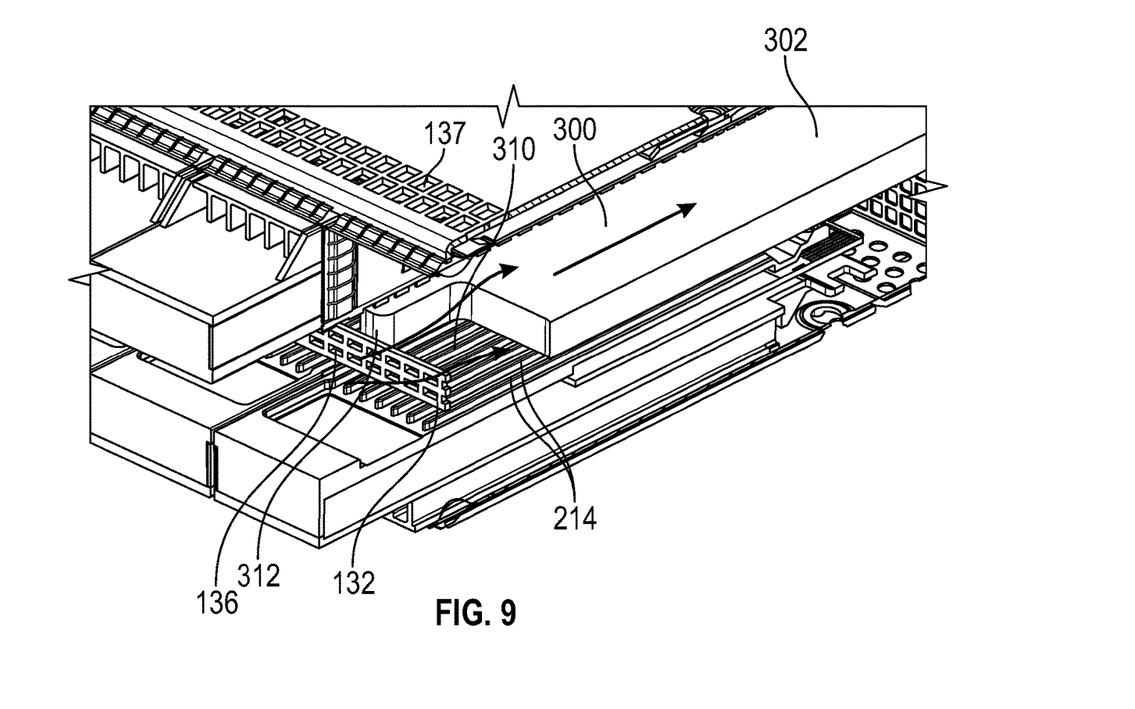
FIG. 9 shows a cross-sectional magnified view taken along line A-A in FIG. 1 of the heat sink on the top of the lower module with the PCB cut-out located above (the first top module and the first top cage are hidden for ease in viewing).

FIGS. 7-9 illustrate the arrangement of the host PCB 300 within the switch system 100. As can be seen in FIG. 8, in some embodiments, airflow openings 440 on bottom side 404 of cages 400 are aligned with PCB cut-outs 310. This allows for the airflow to flow in two paths around the host PCB 300. A first upper path is: from the front side 306 of the host PCB 300, through vent openings 136 in central horizontal divider 132 of front faceplate 130, into the space formed by cut-outs 310, up through the airflow openings 440 on the bottom side 404 of the cages 400 (which are located in top compartments 138), between the projections 214 of first heat sink 220 of modules 200 (which are located in cages 400 in top compartments 138), and over top surface 302 of PCB 300 towards back side 308. A second lower path is: from the front side 306 of the host PCB 300, through vent openings 136 in central horizontal divider 132 of front faceplate 130, into the space formed by cut-outs 310, down through the airflow openings 440 on the bottom side 404 of the cages 400 (which are flipped and located in bottom compartments 140), between the projections 214 of first heat sink 220 of modules 200 (which are flipped and located in cages 400 in bottom compartments 140), and over bottom surface 304 of PCB 300 towards back side 308. FIG. 9 has additional parts hidden to more clearly show the first heat sink 220 with projections 214 on the bottom surface 204 of the module 200, which is shown in the middle of the system 100 because it is flipped.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents may be employed without departing from the scope of the disclosure as defined by the claims.

The invention claimed is:

1. A switch system comprising:
   a frame comprising at least one top compartment and at least one bottom compartment;
   a host printed circuit board (PCB) located between the at least one top compartment and the at least one bottom compartment, said host PCB having at least one cut-out;
   a plurality of cages, wherein each cage of the plurality of cages comprising a first surface having a plurality of airflow openings therethrough,
   wherein each cage is configured to receive one module of a plurality of modules, each module comprising a first heat sink therein,
   wherein at least one cage is received in the at least one top compartment such that the first surface faces towards the host PCB, and wherein the at least one cage located in the at least one top compartment is configured to receive at least one module such that the first heat sink faces towards the host PCB,
   wherein at least one cage is received in the at least one bottom compartment such that the first surface faces towards the host PCB, and wherein the at least one cage located in the at least one bottom compartment is configured to receive at least one module such that the first heat sink faces towards the host PCB,
   wherein the at least one cut-out of the host PCB is aligned with the plurality of airflow openings, and
   wherein an airflow from a front of the switch system to a rear of the switch system is facilitated by the plurality of airflow openings, the at least one cut-out, and the first heat sink.

2. The switch system of claim 1, further comprising the plurality of modules.

3. The switch system of claim 2, wherein the first heat sink comprises a plurality of projections or fins.

4. The switch system of claim 2, wherein the plurality of modules comprises OSFP (octal small form factor pluggable) modules.

5. The switch system of claim 1, wherein the plurality of airflow openings comprises a matrix of openings forming a grid.

6. The switch system of claim 3, wherein the plurality of airflow openings comprises a matrix of openings forming a grid and a plurality of spaces between the plurality of fins are aligned with the openings forming the grid to facilitate airflow therebetween.

7. The switch system of claim 2, wherein each module of the plurality of modules further comprises a second heat sink.

8. A switch system comprising:
   a first plurality of cages configured to receive a first plurality of modules, each module comprising: a first heatsink located on a bottom side, said first heatsink comprising a first corrugated surface creating a first module airflow channel, each of said first plurality of cages comprising:
      a first plurality of airflow openings to allow air to pass through a bottom of each cage in the first plurality of cages to the first module airflow channel; and
   a printed circuit board (PCB) configured to be located beneath the first plurality of cages and the first plurality of modules, said PCB comprising at least one cut-out, said at least one cut-out configured to be located adjacent to the first plurality of airflow openings,
   wherein air is configured to pass from a front of the PCB, through the at least one cut-out, the first plurality of airflow openings, and the first module airflow channel to a rear of the switch system.

9. The switch system of claim 8, further comprising:
   a second plurality of cages configured to receive a second plurality of modules, each module of the second plurality of modules comprising: a second heatsink located on a top side, said second heatsink comprising a second corrugated surface creating a second module airflow channel, each of said second plurality of cages comprising:
      a second plurality of airflow openings to allow air to pass from a top of each cage in the second plurality of cages to the second module airflow channel,
   wherein the PCB is configured to be located above the second plurality of cages and the second plurality of modules, and said at least one cut-out is configured to be located adjacent the second plurality of airflow openings, and
   wherein air is configured to pass from the front of the PCB, through the at least one cut-out, the second plurality of airflow openings, and the second module airflow channel to a rear of the switch system.

10. The switch system of claim 8, further comprising:
    a frame having a front faceplate with a plurality of front vents, wherein air from the front of the PCB is configured to pass through the plurality of front vents, through the first module airflow channel, and to the rear of the switch system.

11. The switch system of claim 9, further comprising:
    a frame having a front faceplate with a plurality of front vents, wherein air from the front of the PCB is configured to pass through the plurality of front vents, through the first module airflow channel and the second module airflow channel, and to the rear of the switch system.

12. The switch system of claim 9, further comprising the first plurality of modules and the second plurality of modules, wherein the first heatsink or the second heatsink comprises a plurality of projections or fins.

13. The switch system of claim 12, wherein the plurality of projections or fins have a height of about 0.5 mm to about 1.65 mm.

14. The switch system of claim 8, further comprising the first plurality of modules and the second plurality of modules, wherein at least one module comprises an OSFP (octal small form factor pluggable) module.

15. The switch system of claim 9, wherein the first plurality of airflow openings or the second plurality of airflow openings comprises a matrix of openings forming a grid.

16. A method of cooling a switch system comprising:
    providing the switch system comprising:
       a frame comprising a front faceplate having longitudinal divider forming at least one top compartment and at least one bottom compartment;
       a host printed circuit board (PCB) located behind the longitudinal divider and between the at least one top compartment and the at least one bottom compartment;
       a plurality of cages located in the at least one top compartment and the at least one bottom compartment, wherein each cage of the plurality of cages comprises a first surface having a plurality of airflow openings therethrough,
       a plurality of modules, each module received within one of the plurality of cages, wherein each module of the plurality of modules comprises a first heat sink creating a module airflow channel; and wherein each cage is arranged such that the first surface faces towards the host PCB, and each module is arranged such that the first heat sink faces towards the host PCB; and allowing airflow from a front of the switch system to a rear of the switch system around the host PCB through the plurality of airflow openings in the plurality of cages and the module airflow channel in the plurality of cages.

17. The method of claim 16, wherein the host PCB comprises at least one cut-out on a front side, said cut-out being aligned with the plurality of airflow openings, further comprising:

allowing airflow through the at least one cut-out and through the plurality of airflow openings to reach the module airflow channel.

18. The method of claim 16, wherein at least one module comprises an OSFP (octal small form factor pluggable) module.

19. The method of claim 16, further comprising:

providing a second heat sink in each module for further facilitating cooling.

20. The method of claim 16, wherein the first heat sink comprises a plurality of longitudinal projections.

* * * * *